(12) United States Patent
Bajaj et al.

(10) Patent No.: US 9,419,016 B2
(45) Date of Patent: Aug. 16, 2016

(54) JUNCTIONLESS TUNNEL FET WITH METAL-INSULATOR TRANSITION MATERIAL

(71) Applicant: International Business Machines Corporation, Armonk, NY (US)

(72) Inventors: Mohit Bajaj, Bangalore (IN); Suresh Gundapaneni, Bangalore (IN); Aniruddha Konar, Bangalore (IN); Kota V. R. M. Murali, Bangalore (IN); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/537,188

(22) Filed: Nov. 10, 2014

(65) Prior Publication Data
US 2016/0133648 A1    May 12, 2016

(51) Int. Cl.
| | |
|---|---|
| *H01L 29/02* | (2006.01) |
| *H01L 27/12* | (2006.01) |
| *H01L 29/66* | (2006.01) |
| *H01L 29/51* | (2006.01) |
| *H01L 29/423* | (2006.01) |
| *H01L 29/10* | (2006.01) |

(Continued)

(52) U.S. Cl.
CPC ...... *H01L 27/1211* (2013.01); *H01L 21/02175* (2013.01); *H01L 21/02181* (2013.01); *H01L 21/845* (2013.01); *H01L 29/1033* (2013.01); *H01L 29/42364* (2013.01); *H01L 29/511* (2013.01); *H01L 29/517* (2013.01); *H01L 29/66977* (2013.01)

(58) Field of Classification Search
CPC ............ H01L 49/003; H01L 29/4966; H01L 29/7833; H01L 29/66545; H01L 29/4983
USPC ........................................................ 438/310
See application file for complete search history.

(56) References Cited

U.S. PATENT DOCUMENTS

| | | | |
|---|---|---|---|
| 6,121,642 A * | 9/2000 | Newns | H01L 49/003 257/192 |
| 6,274,916 B1 | 8/2001 | Donath et al. | |
| 6,333,543 B1 | 12/2001 | Schrott et al. | |

(Continued)

FOREIGN PATENT DOCUMENTS

| | | |
|---|---|---|
| CN | 103280464 | 9/2013 |
| CN | 103606563 A | 2/2014 |
| WO | 2011152938 A1 | 12/2011 |

OTHER PUBLICATIONS

B. Ghosh et al., "Junctionless tunnel field effect transistor," IEEE Electron Device Letters, vol. 34, No. 5, 2013, pp. 584-586.

(Continued)

*Primary Examiner* — Michael Lebentritt
(74) *Attorney, Agent, or Firm* — Steve J. Meyers; Hoffman Warnick LLC

(57) ABSTRACT

Embodiments of the present disclosure provide an integrated circuit (IC) structure, which can include: a doped semiconductor layer having a substantially uniform doping profile; a first gate structure positioned on the doped semiconductor layer; and a second gate structure positioned on the doped semiconductor layer, the second gate structure including a metal-insulator transition material and a gate dielectric layer separating the metal-insulator transition material from the doped semiconductor layer.

20 Claims, 6 Drawing Sheets

(51) Int. Cl.
*H01L 21/84* (2006.01)
*H01L 21/02* (2006.01)

(56) References Cited

U.S. PATENT DOCUMENTS

| | | | |
|---|---|---|---|
| 6,365,913 B1* | 4/2002 | Misewich | H01L 49/003 257/289 |
| 6,555,393 B2 | 4/2003 | Schrott et al. | |
| 6,933,553 B2 | 8/2005 | Kim et al. | |
| 7,408,217 B2 | 8/2008 | Yoon et al. | |
| 8,178,862 B2 | 5/2012 | Colinge | |
| 8,384,122 B1 | 2/2013 | Hu et al. | |
| 8,395,942 B2 | 3/2013 | Samachisa et al. | |
| 8,405,124 B2* | 3/2013 | Karg | H01L 27/11803 257/194 |
| 8,686,485 B2 | 4/2014 | Kim | |
| 8,896,035 B2* | 11/2014 | Murali | H01L 21/28088 257/288 |
| 2003/0054615 A1* | 3/2003 | Kim | H01L 49/003 438/310 |
| 2003/0201495 A1* | 10/2003 | Doderer | H01L 49/003 257/347 |
| 2004/0245582 A1* | 12/2004 | Kim | H01L 49/003 257/394 |
| 2007/0085122 A1* | 4/2007 | Hyun | H01L 27/101 257/296 |
| 2010/0140589 A1 | 6/2010 | Ionescu | |
| 2011/0073909 A1 | 3/2011 | Chang et al. | |
| 2012/0161202 A1 | 6/2012 | Cappellani et al. | |
| 2012/0286350 A1 | 11/2012 | Doris et al. | |
| 2013/0075817 A1 | 3/2013 | Cheng et al. | |
| 2013/0078777 A1 | 3/2013 | Cheng et al. | |
| 2013/0119395 A1 | 5/2013 | Bhuwalka et al. | |
| 2013/0203248 A1 | 8/2013 | Ernst et al. | |
| 2014/0110765 A1 | 4/2014 | Murali et al. | |

OTHER PUBLICATIONS

B. Ghosh et al., "A junctionless tunnel field effect transistor with low subthreshold slope," Journal of Computational Electronics, vol. 12, No. 3, 2013, pp. 428-436.

S. Sengupta et al., "Field-effect modulation of conductance in $VO_2$ nanobeam transistors with $HfO_2$ as the gate dielectric," Appl. Phys. Lett., vol. 99, No. 6, 2011, 062114, 3 pages.

* cited by examiner

JUNCTIONLESS TUNNEL FET WITH METAL-INSULATOR TRANSITION MATERIAL

BACKGROUND

The disclosure relates generally to structures and manufacturing processes for junctionless tunnel field effect transistors (FETs). More specifically, embodiments of the present disclosure include a junctionless tunnel FET structure with a metal-insulator transition material therein, and processes for fabricating the junctionless tunnel FET structure.

In integrated circuit (IC) structures, a transistor is a critical component for implementing digital circuitry designs. A conventional transistor includes three electrical terminals: a source, a drain, and a gate. By applying different voltages to the gate terminal, the ability for electric current to flow between the source and the drain can be turned on and off. A common type of transistor is a field effect transistor (FET). A FET can include a gate structure, typically composed of polysilicon and/or a metal, formed on and contacting an insulator placed on top of the semiconductor layer positioned between the source and the drain. The semiconductor layer can include various dopants therein, with one type of doping adjacent to the source, and another type of doping (i.e., complementary doping) adjacent to the drain, to form a p-n junction. By applying a voltage to the gate structure, an electrically conductive channel can be created within the semiconductor layer between the source and drain terminals.

For particular implementations, the design of a FET can be adapted to provide different characteristics. One alternative type of FET structure, known as a junctionless FET, includes a semiconductor layer, with a single type (i.e., p+ or n−) of doping, positioned between a source and drain. Although a junctionless FET is relatively simple to fabricate, the sub-threshold slope (i.e., the change in gate voltage required to increase the source to drain current by one order) may be limited due to conventional over the barrier carrier transport. Another alternative FET structure, known as a tunnel FET, can include a gate contact separated from a buried semiconductor layer by an interconnect material (e.g., doped polycrystalline silicon). The buried semiconductor layer can include multiple types of semiconducting materials and dopants, such that controlling a voltage of the gate influences current flow between a source contact and a drain contact at two ends of the buried semiconductor layer. A tunnel FET may have limited opportunities for use because fabricating the various semiconductor materials and introducing dopants to the buried semiconductor layer can increase manufacturing costs and complexity.

BRIEF SUMMARY

A first aspect of the disclosure provides an integrated circuit (IC) structure, which can include: a doped semiconductor layer having a substantially uniform doping profile; a first gate structure positioned on the doped semiconductor layer; and a second gate structure positioned on the doped semiconductor layer, the second gate structure including a metal-insulator transition material and a gate dielectric layer separating the metal-insulator transition material from the doped semiconductor layer.

A second aspect of the disclosure provides a method of forming an integrated circuit (IC) structure, which can include: forming a doped semiconductor layer on an insulator layer, the doped semiconductor layer having a substantially uniform doping profile; forming a dielectric layer on the doped semiconductor layer; and forming a first gate material and a second gate material on the dielectric layer, wherein the second gate material includes a metal-insulator transition material.

A third aspect of the disclosure provides an integrated circuit (IC) structure comprising: a doped semiconductor layer having a substantially uniform doping profile; a first gate structure contacting the doped semiconductor layer and including: a first gate material contacting a dielectric layer, and a dielectric layer positioned between the first gate material and the doped semiconductor layer; and a second gate structure contacting the doped semiconductor layer, the second gate structure including: a second gate material including a metal-insulator transition material therein, and the dielectric layer, wherein the dielectric layer is positioned between the metal-insulator transition material and the doped semiconductor layer; wherein a voltage bias applied to the first gate structure increases the electric field and a conductivity of the metal-insulator transition material.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements among the drawings.

DETAILED DESCRIPTION

Figure 1:
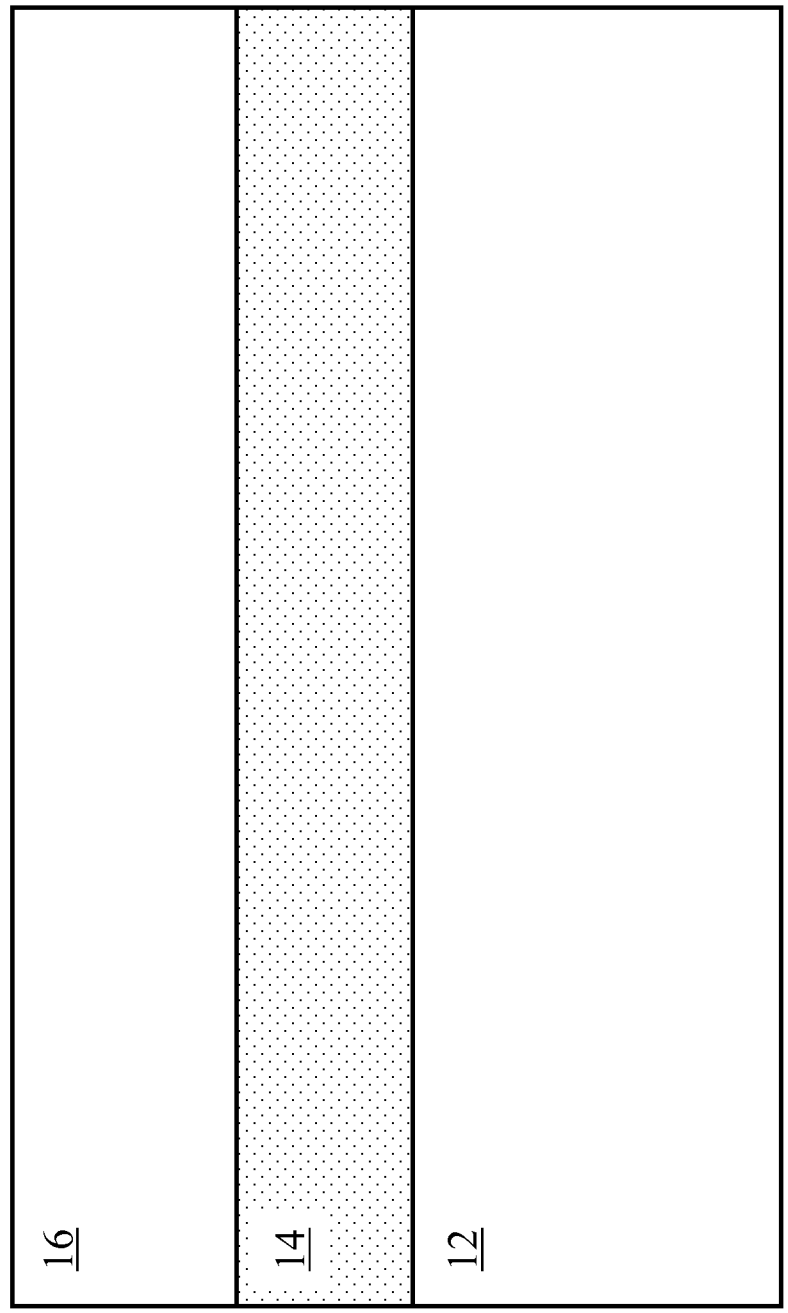
FIGS. 1-5 show processes of forming an integrated circuit (IC) structure according to embodiments of the present disclosure.

Embodiments of the present disclosure provide an integrated circuit (IC) structure which, in operation, can have a lower sub-threshold slope (i.e., the change in gate voltage required to increase the source to drain current by one order) than a junctionless FET.

In an embodiment, an IC structure of the present disclosure can have a subthreshold slope of less than sixty millivolts (mV) per decade (mV/dec). In addition, embodiments of the present disclosure include a doped semiconductor layer which includes a substantially uniform doping profile.

Embodiments of the present disclosure can include a doped semiconductor layer with a "substantially uniform" doping profile therein. As used herein, the term "substantially uniform" refers to a concentration of dopants (measured, e.g., in atoms per cubic centimeter) which is either uniform throughout a material or includes insignificant variances in concentration, such that the doped semiconductor layer is indistinguishable from a uniformly doped semiconductor layer during operation. As an example, a "substantially uniform doping profile" can include regions with a larger or smaller concentration of dopants within a particular margin of error, e.g., within approximately three percent or approximately five percent of a desired dopant concentration. Other example ranges of substantially uniform dopant concentrations are discussed herein. Two gate structures, referred to herein as a "first gate structure" and a "second gate structure," can be positioned on the doped semiconductor layer.

One of the two gate structures (e.g., the second gate structure) can include a metal-insulator transition material therein. A gate dielectric material can be positioned between the metal-insulator transition material and the doped semiconductor layer. A metal-insulator transition material generally refers to any material which transitions from having electrically insulative properties to electrically conductive properties after undergoing a particular change, such as an increase in temperature or an electric field being created and passing through the material. In operation, applying a voltage to the first gate structure (i.e., the gate without a metal-insulator transition material therein) can cause an electric current to pass through the doped semiconductor layer and create an electric field (i.e., a difference in electric potential) across the metal-insulator transition material of the second gate structure. This electric field across the metal-insulator transition material can cause the material to become conductive, and thus reduce the value of its work function (i.e., energy needed to move an electron from within an atom of a material to outside the atom). A difference in the work function between the now conductive metal-insulator transition material and the doped semiconductor layer can form a depletion region in the doped semiconductor layer, proximal to the second gate structure. A "depletion region" or simply "depletion" generally refers to a region in a semiconductor material where the concentration of free carrier atoms is lower than in an equilibrium state, which may be caused, e.g., by the passage of an electric current through the material. The forming of this depletion may create a band overlap between the valence and conductive bands of the doped semiconductor material (i.e., an electrically conductive area) between regions where the depletion is formed and a region of the doped semiconductor material proximal to the first gate structure. Thus, using a second gate structure with a metal-insulator transition material can provide an advantage over other transistors, including the ability to form a channel in a semiconductor structure without complementary doping.

Turning to FIG. 1, a process according to aspects of the present disclosure is shown. Methods of the present disclosure can include forming an integrated circuit (IC) structure, which can function as a field effect transistor (FET) during operation. A substrate 12 can be composed of any currently known or later developed semiconductor material, which may include without limitation, silicon, germanium, silicon carbide, and substances consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substances can include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of substrate 12 or a portion thereof may be strained.

An insulator layer 14 can be formed on and positioned above substrate 12. Insulator layer 14 may be composed of any insulating material such as $SiO_2$ or a dielectric having a high dielectric constant, which may be, for example, above 3.9. In some situations, insulator layer 14 may be composed of an oxide substance, and correspondingly may be referred to as a buried oxide (BOX) layer. Materials appropriate for the composition of insulator layer 14 may include, for example, silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later developed materials having similar properties.

A semiconductor layer 16 can be formed on insulator layer 14. One process by which semiconductor layer 16 can be formed on insulator layer 14 is wafer bonding. "Wafer bonding" generally can refer to a process in which two semiconductor wafers are bonded together, forming a single substrate material. The bonded semiconductor wafers can be cut using any currently known or later developed semiconductor or SOI fabrication process. As one example, a semiconductor material can be formed by implanting a bonded wafer with hydrogen and then annealing the wafer, causing it to split along the plane of the implanted hydrogen. Semiconductor layer 16 can, together with substrate 12 and insulator layer 14, form a semiconductor-on-insulator (SOI) structure. Semiconductor layer 16 can be composed of, for example, silicon or another semiconductor material, and optionally may have the same material composition as substrate 12.

Figure 2:
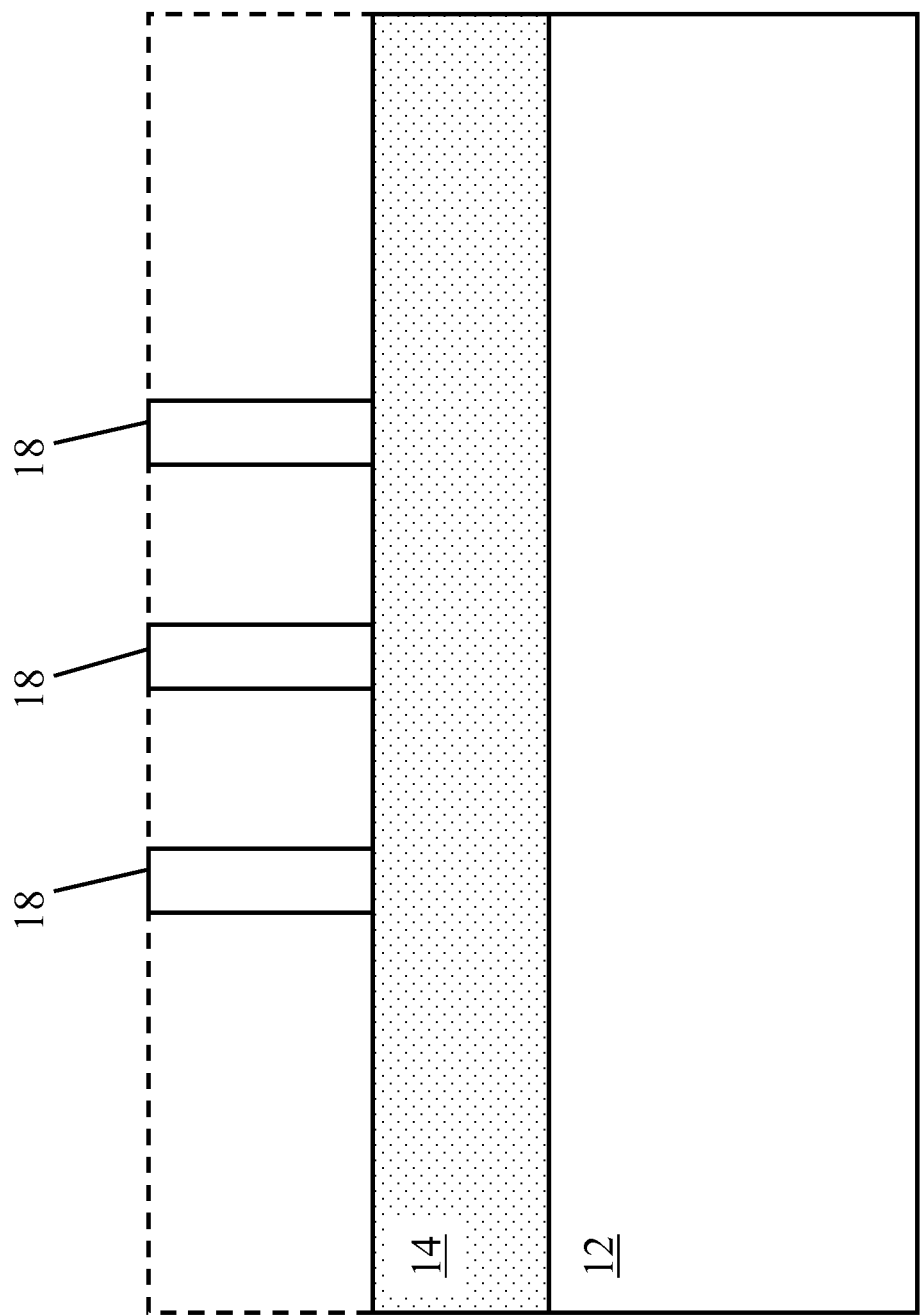

Turning to FIG. 2, a view of substrate 12, insulator layer 14, and semiconductor layer 16 undergoing an optional process according to the present disclosure is shown. Some IC structures according to embodiments of the present disclosure can take the form of a finFET component. A finFET generally refers to a FET design typically built from an SOI substrate, where semiconductor material positioned on a buried insulator layer is etched into one or more fin-shaped structures to act as a channel, and a gate component is formed around and over the fin(s). Following the formation of semiconductor layer 16, one or more semiconductor fins 18 can be formed therefrom via any currently known or later developed process of removing a portion of a semiconductor material, e.g., depositing a material and performing a pattern etch. As discussed herein, "removing" can include any one of various material removal or polishing techniques now known or later developed, e.g., etching, a reactive ion etch (RIE), etc. "RIE" or "reactive ion etch" refers to a variation of plasma etching in which, during etching, a semiconductor wafer is placed on an RF powered electrode. Throughout RIE, the wafer may take on an electric potential which accelerates the etching species extracted from plasma toward the etched surface. Although three semiconductor fins 18 are shown in FIG. 1 by way of example, a single FinFET structure can include only one semiconductor fin 18, or any desired greater number of semiconductor fins (e.g., five fins, ten fins, twenty fins, etc.)

Figure 3:
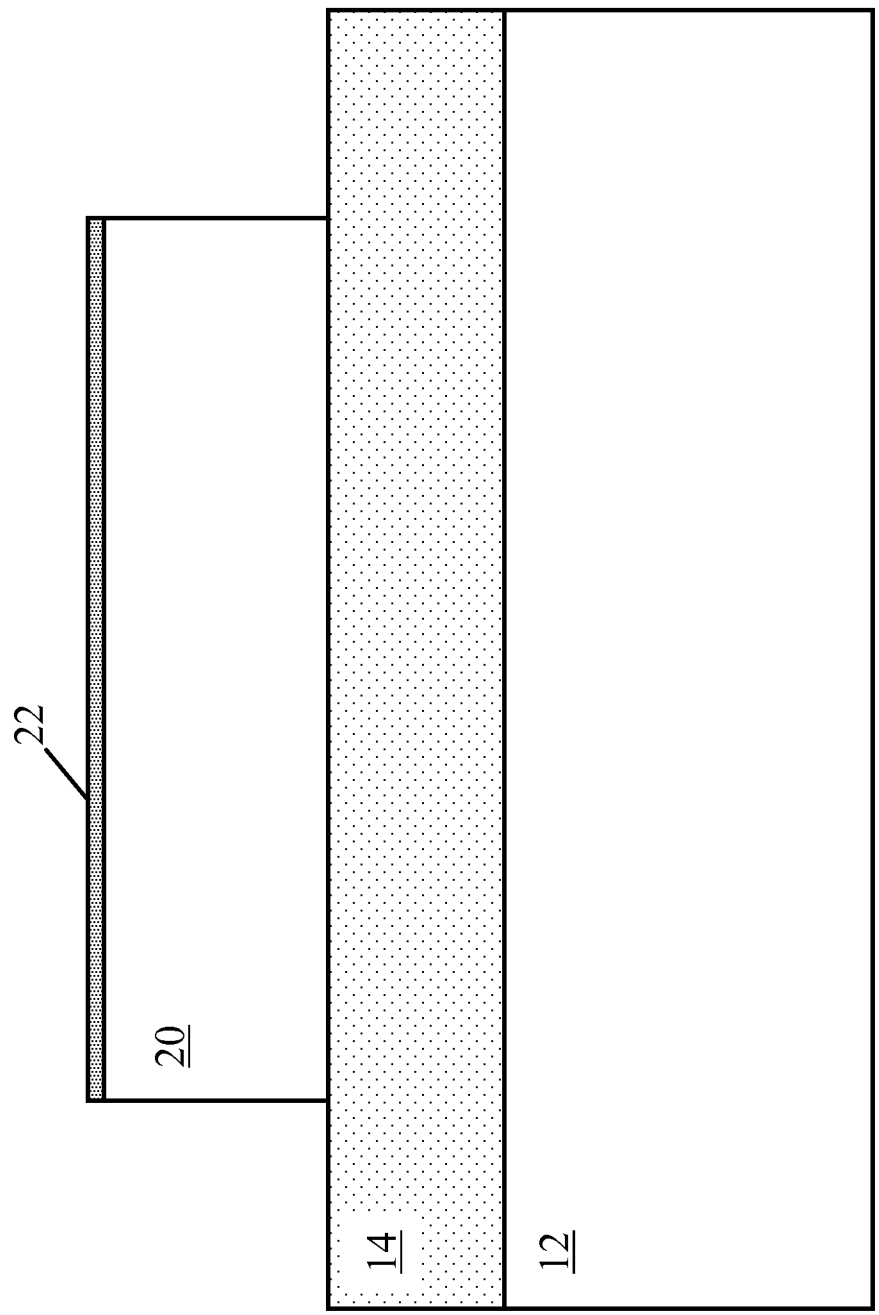

Turning to FIG. 3, another process step according to embodiments of the present disclosure is shown. The view of FIG. 3 returns to the side view provided in FIG. 1. To form an IC structure according to embodiment of the present disclosure, a doped semiconductor layer 20 can be formed on insulator layer 14. Doped semiconductor layer 20 can be formed from semiconductor layer 16 (FIG. 1) or semiconductor fins 18 (FIG. 2) by, e.g., introducing dopant atoms into semiconductor layer 16 or semiconductor fin(s) 18 to change the electrical properties of the material. In an example embodiment, where semiconductor layer 16 or semiconductor fins 18 include silicon, the material can be doped with a p-type dopant such as boron, or an n-type dopant such as phosphorous, arsenic, or antimony. In any case, doped semiconductor layer 20 can have a substantially uniform doping profile. For example, doped semiconductor layer 20 can be doped with only p-type or n-type dopants to create substantially uniform electrical properties throughout its material composition. More specifically, doped semiconductor layer 20 can be doped with only a single type of doping material. In one example, doped semiconductor layer 20 can be doped with an n-type dopant in a concentration between approximately $1.0\times 10^{19}$ atoms per cubic centimeter (atoms/cm$^3$) and approximately $3.0\times 10^{19}$ atoms/cm$^3$. The doping profile of doped semiconductor layer 20 can be "substantially uniform" where the concentration of dopants throughout the material is within a particular margin of error (e.g., greater or less than five percent) of a predetermined value within this approximate range of values. A dielectric layer 22 can also be formed on doped semiconductor layer 20, e.g., by thermally growing a dielectric material such as silicon dioxide (SiO$_2$) or hafnium oxide (HfO$_2$) on doped semiconductor layer 20 and then nitriding the grown material, or by any other currently known or later developed process of forming a dielectric material. Dielectric layer 22 may have different properties from insulator layer 14. Specifically, dielectric layer 22 as discussed elsewhere herein can function as a gate dielectric positioned between doped semiconductor layer 20 and a gate structure. Dielectric layer 22 in operation can provide, e.g., reduced current leakage between doped semiconductor layer 20 and other electrical components while the IC structure is in an "off" state.

Figure 4:
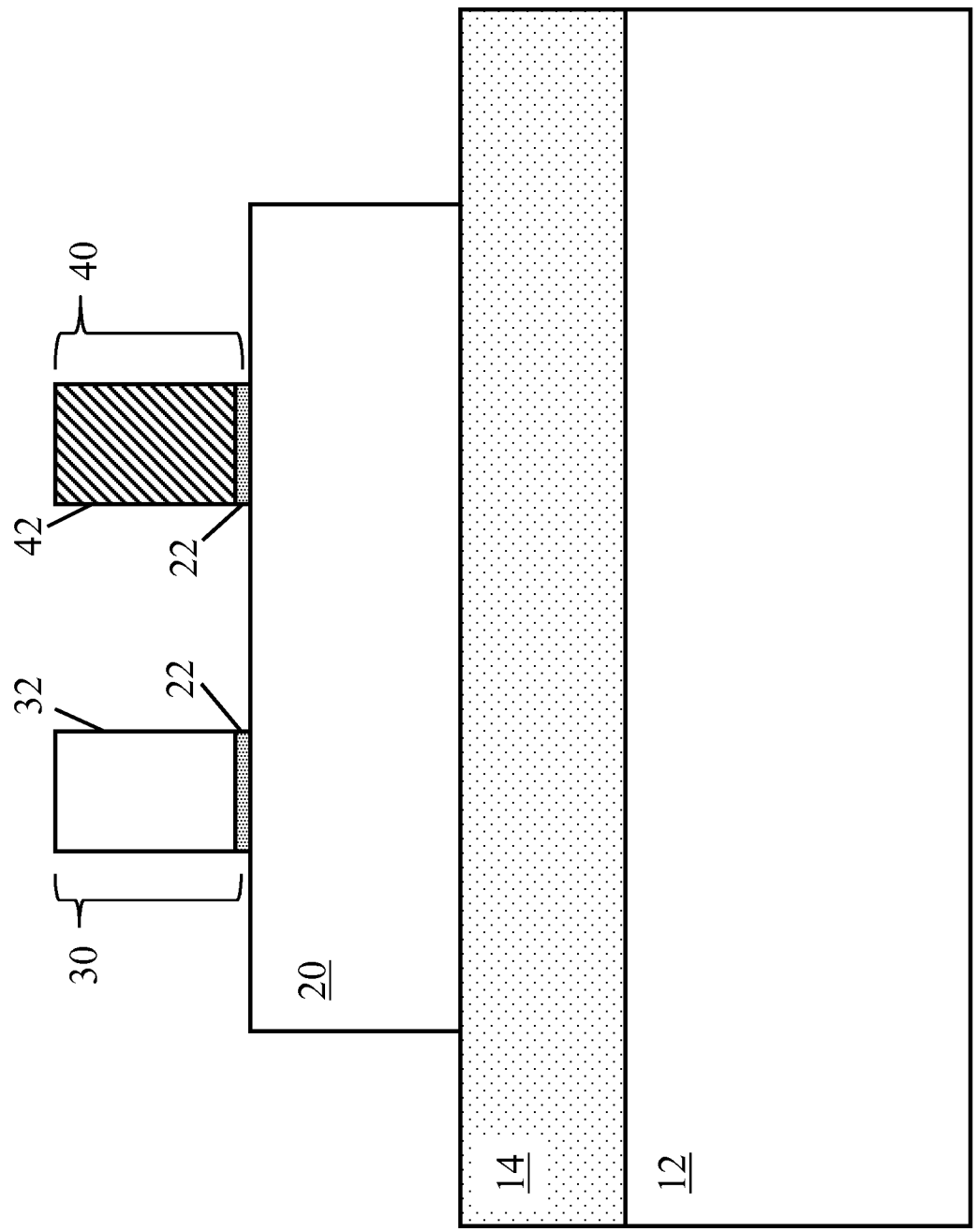

Turning to FIG. 4, other processes according to the present disclosure are shown. A first gate structure 30 can be formed on dielectric layer 22, e.g., by deposition or other currently known or later developed process. First gate structure 30 can include a first gate material 32 on first dielectric layer 22. First gate material 32 can be a gate conductor composed of, at least partially, a conductive material, including without limitation, copper or other conductive metals, polycrystalline silicon, and/or a silicide material. A work function (i.e., energy needed to move an electron from within an atom to outside the atom) of first gate material 32 can be between approximately 4.3 electron-volts (eV) and approximately 4.6 eV. In addition, a second gate structure 40 can be formed on dielectric layer 22, e.g., by deposition or other currently known or later developed process. Second gate structure 40 can include a second gate material 42 on second dielectric layer 22. Second gate material 42 can be composed wholly or partially of a metal-insulator transition material. A metal-insulator transition material generally includes any material which can either have electrically insulative or electrically conductive properties based on a particular change or property, e.g., whether an electric field passes through the material. In a specific embodiment, second gate material 42 can include vanadium oxide (i.e., a compound with the chemical formula V$_x$O$_y$, such as VO$_2$). A work function of vanadium oxide can be approximately 5.3 electron-volts (eV) when in an insulating state, and approximately 5.1 eV when in a conductive state. Portions of second dielectric layer 22 can be removed previous to or following the forming of first gate material 32 and second gate material 42, e.g., by etching or any other currently known or later developed process.

Figure 5:
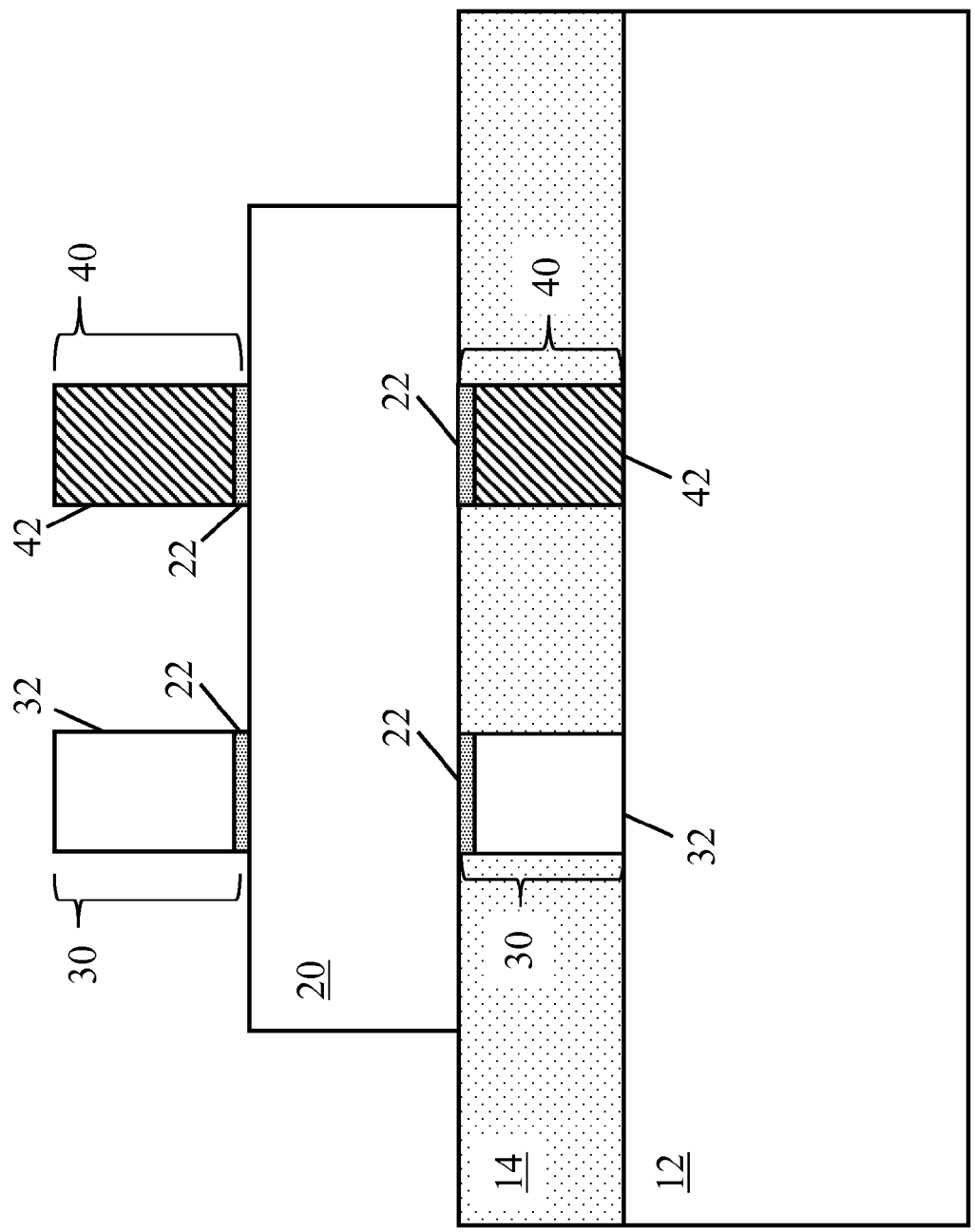

Although first gate structure 30 and second gate structure 40 are shown by example as positioned atop doped semiconductor layer 20 and dielectric layer 22, it is understood that other arrangements are possible in embodiments of the present disclosure. An alternative embodiment where first and second gate structure 30, 40 are provided in additional locations is shown in FIG. 5. For example, before doped semiconductor layer 20 is formed, a portion of insulator layer 14 can be removed (e.g., by etching), and first and second gate materials 32, 42 can be formed (e.g., by deposition) in the etched portions of insulator layer 14. A portion of the formed first and second gate materials 32, 42 can be removed (e.g., by etching) and filled with dielectric layer 22. In this way, first gate structure 30 and second gate structure 40 can be formed beneath doped semiconductor layer 20 where desired. As is shown in FIG. 5, two first gate structures 30 and two second gate structures 40 can be formed, e.g., on opposing sides of doped semiconductor layer 20. Where first gate structure 30 and second gate structure 40 are formed within insulator layer 14, metal wires, vias, conductive regions, or other types of electrical components (not shown) can electrically couple first gate structure 30 to other components, such as voltage sources and/or other IC elements.

Figure 6:
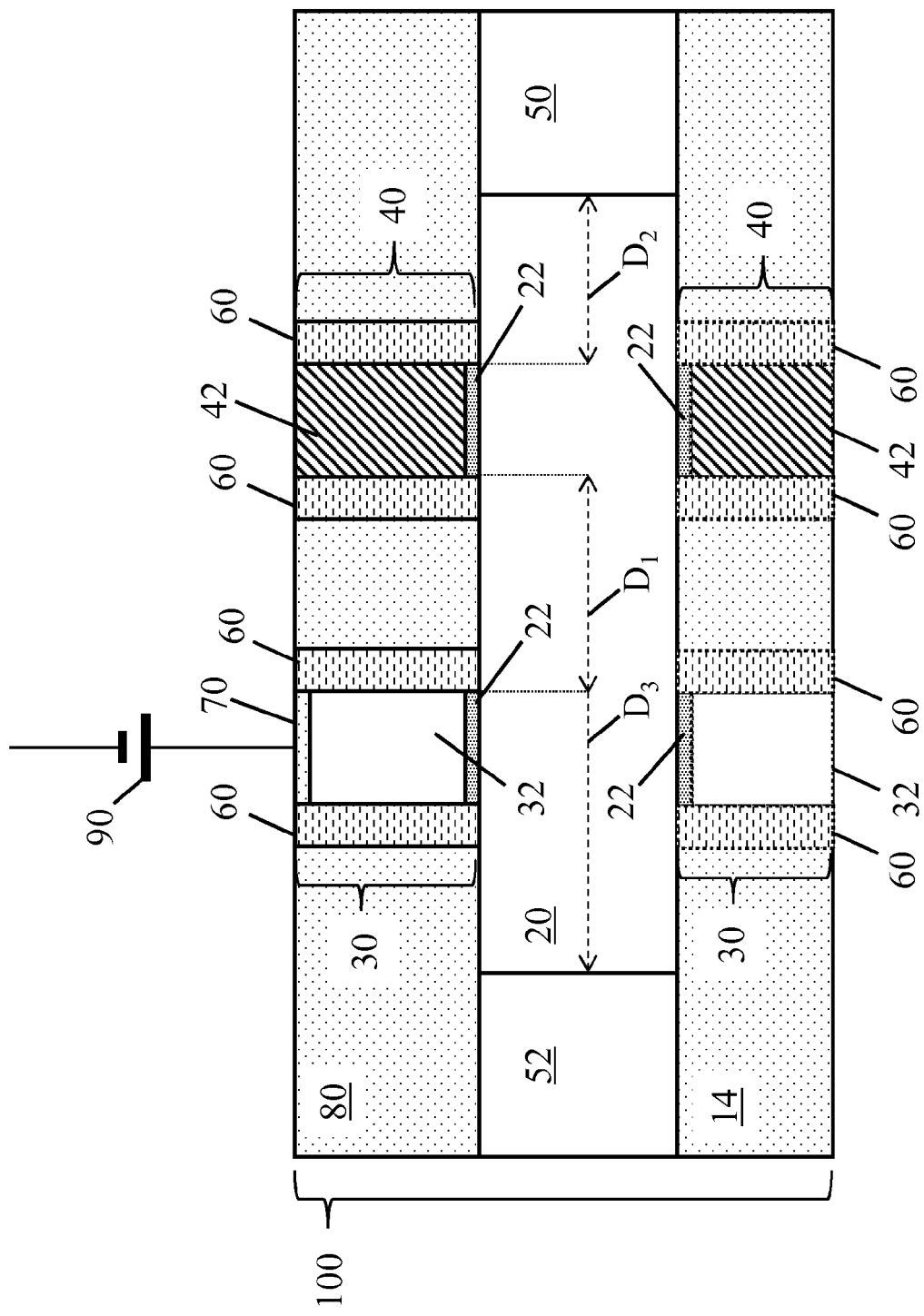
FIG. 6 shows an IC structure according to embodiments of the present disclosure.

Turning to FIG. 6, additional processes of forming an IC structure in embodiments of the present disclosure are shown. A source contact 50 and a drain contact 52 can be formed (e.g., by deposition or any other currently known or later developed process) on insulator layer 14 at opposing ends of doped semiconductor layer 20. Source contact 50 and drain contact 52 may be composed of a conductive material, such as a metal, to provide an ohmic contact between doped semiconductor layer 20 and other electrical components. An ohmic contact generally refers to a metal-semiconductor contact with a low value of electrical resistance, such that no insulating barriers are formed at the interface between the metal and semiconductor materials. It is also understood that, in some embodiments, the position of source contact 50 and drain contact 52 may be interchanged with each other based on, e.g., the polarity of doping in doped semiconductor layer 20. Source and drain contacts 50, 52 can thus provide an electrical interface between the IC structure of the present disclosure and other IC features or elements, such as transistors, load components, capacitors, metal wires, vias, etc.

One or more spacers 60 can be formed on doped semiconductor layer 20 and placed in contact with first and/or second gate structures 30, 40, e.g., by being deposited onto doped semiconductor layer 20 or dielectric layer 22. Spacers 60 can increase electrical isolation between first and/or second gate structures 30, 40 from other components of an IC structure, e.g., source and drain terminals 50, 52. Spacers 60 can also support the structural interface between doped semiconductor layer 20 and first and second gate structures 30, 40, particularly in embodiments where doped semiconductor layer 20 is formed from semiconductor fin(s) 18 (FIG. 2) and the resulting IC structure uses a finFET design. For example, spacers 60 can provide structural support to doped semiconductor layer 20 formed from one semiconductor fin 18 (FIG. 2) after other intervening materials (e.g., portions of semiconductive and/or dielectric materials) are removed. Although doped semiconductor layer 20 is shown for the purposes of illustration as having four spacers 60 thereon, it is also understood that spacers 60 can alternatively be formed as a coating on first and second gate structures 30, 40. In addition, where first and second gate structures 30, 40 (shown in phantom) extend through insulator layer 14 (e.g., as shown in FIG. 5 and discussed herein), spacers 60 (shown in phantom) can be formed therein, e.g., by selectively removing portions of insulator layer 14 adjacent to first and second gate structures 30, 40, and forming (e.g., by deposition or other process) spacers 60 in the removed portions. Spacers 60 can be composed of, e.g., an insulating material such as a nitride or an oxide compound, including, for example, the various types of insulating materials described herein.

Processes of the present disclosure can include forming interlayer contact 70 on first gate structure 30 where first gate material 32 includes silicon. In an embodiment, interlayer contact 70 may be formed as silicide contacts using any now known or later developed technique, e.g., performing an in-situ pre-clean, depositing a metal such as titanium, nickel, cobalt, etc., annealing to have the metal react with silicon, and removing any unreacted metal. If desired, interlayer contact 70 can be formed using a self-aligned silicide ("salicide") process. A salicide process refers to a process in which interlayer contact 70 is formed only in areas where deposited metal is in direct contact with silicon. As an alternative to forming interlayer contact 70 on first gate structure 30, embodiments of the present disclosure can optionally use a mask (not shown) to remove an edge portion of first gate material 32 before forming a conductive substance, such as a metal, where the edge portion was removed to create interlayer contact 70.

An interlayer dielectric 80 can be formed upon the remainder of doped semiconductor layer 20 and source, drain contacts 50, 52 to, e.g., further electrically isolate the formed IC structure from other electrical components and/or provide a structural foundation for other electrical components. Interlayer dielectric 80 can be composed of an electrically insulating material such as, e.g., one of the dielectric materials discussed herein, which may be in the form of a solid component, a flowable oxide, and/or a gas dielectric material (e.g., a partially or completely gaseous substance with electrically insulative properties, such as air). Interlayer dielectric 80 and insulator layer 14 may be composed of the same materials, or may be composed of different materials where desired.

Locations for forming first and second gate structures 30, 40 on doped semiconductor layer 20 can be selected to control channeling in doped semiconductor layer 20 during operation. In an embodiment, a separation distance $D_1$ between first and second gate structures 30, 40 may be larger than a separation distance $D_2$ between second gate structure 40 and source contact 50. This arrangement of components can allow the conductivity of second gate structure 40 to create depletion in doped semiconductor layer 20 proximal to source contact 50 without creating depletion in semiconductor layer 20 proximal to drain contact 52, thereby creating a band overlap between these two regions of doped semiconductor layer 20. In some embodiments, separation distance $D_2$ may be approximately zero (i.e., less than one nm), and separation distance $D_1$ can be between approximately two nanometers (nm) and approximately five nm. This arrangement can form depletion regions in doped semiconductor layer 20 between first gate structure 30 and source contact 50 as electric when a voltage bias to first gate structure 30 creates an electric field across second gate structure 40, as discussed elsewhere herein.

Processes of the present disclosure can include changing the electrical properties of doped semiconductor layer 20 (e.g., conductivity between source and drain contacts 50, 52) by biasing first gate structure 30 to create an electric field across the metal-insulator transition material of second gate material 42. Where second gate material 42 includes $VO_2$, the material can transition to a conductive state in response to a voltage bias of first gate structure 30 causing electric current to enter doped semiconductor layer 20. The voltage bias to first gate structure 30 can cause an electric field to pass through second gate structure 40, thereby causing the material to become conductive and experience a reduction in work function (e.g., by approximately two tenths of an eV). The voltage bias can be provided from a first voltage source 90 electrically coupled to first gate structure 30. This can cause a difference in work function between doped semiconductor layer 20 and second gate structure 40, inducing electrons to flow doped semiconductor layer 20 into second gate structure 20. As a result, a depletion can form in doped semiconductor layer 20 proximal to source contact 50. The created depletion can change the electrical properties of doped semiconductor layer 20 by creating a band overlap between the region where the depletion is formed, proximal to source contact 50, and a region of doped semiconductor layer 20 proximal to drain contact 52. The band overlap effectively creates a conductive channel between source and drain contacts 50, 52 as a result of a voltage bias being applied to first gate structure 30.

Processes according to the present disclosure can form an IC structure 100 which operates as a junctionless tunnel FET and uses the properties of a metal-insulator transition material to switch quickly between "on" and "off" states. IC structure 100 can include doped semiconductor layer 20 with the substantially uniform doping profile discussed herein, and electrically coupled to first and second gate structures 30, 40. As is shown in FIG. 6, IC structure 100 can include multiple first and second gates, optionally positioned adjacent to opposing surfaces of doped semiconductor layer 20. The substantially uniform doping profile of doped semiconductor layer can be between, e.g., approximately $1.0\times10^{19}$ atoms per cubic centimeter (atoms/cm$^3$) and approximately $3.0\times10^{19}$ atoms/cm$^3$. First gate structure 30 can be in contact with doped semiconductor layer 20, e.g., through dielectric layer 22, and can include first gate material 32 therein. First gate material 32 can include or be in the form of a gate conductor, such as one of the conductive materials discussed elsewhere herein.

Second gate structure 40 of IC structure 100 may also be in contact with doped semiconductor layer 20 through dielectric layer 22, and may include second gate material 42 with a metal-insulator transition material therein. The metal-insulator transition material of second gate material 42 may be composed at least partially of vanadium oxide. In operation, a voltage bias applied from first voltage source 90 to first gate structure 30 can create a flow of electric current through doped semiconductor layer 20 and induce an electric field across second gate structure 40. The induced electric field can cause the metal-insulator transition material of second gate material 42 to become conductive. A difference in work function between doped semiconductor layer 20 and second gate structure 40 can cause migration of electrons from doped semiconductor layer 20 to deplete the material composition of doped semiconductor layer 20. The depletion at one end of doped semiconductor layer 20 can cause a band overlap between the two regions of semiconductor layer 20, proximal to source contact 50 and drain contact 52, respectively, thereby forming a conductive channel through doped semiconductor layer 20.

As described elsewhere herein, first gate structure 30 and second gate structure 40 of IC structure 100 can be positioned to create particular electrical characteristics. In an embodiment, a separation distance $D_3$ between second gate structure 40 and drain contact 52 (or other ohmic contact proximal to first gate structure 30) can be larger than separation distance $D_1$ between second gate structure 40 and source contact 50 (or other ohmic contacts in the same position). In a more specific embodiment, the separation distance between first gate structure 30 and second gate structure 40 can be between approximately two nm and approximately five nm. In this arrangement, the depletion in doped semiconductor layer 20 caused from biasing first gate structure 30 can be most concentrated proximal to a particular ohmic contact (e.g., source contact 50), without creating a depletion proximal to the opposing ohmic contact (e.g., drain contact 52). In operation, the electrical properties of IC structure 100 can allow a band overlap between two portions of doped semiconductor layer 20 when a voltage bias (i.e., from voltage source 90) is applied to first gate structure 30, even though doped semiconductor layer 20 includes a substantially uniform doping profile. IC structure 100 can therefore include source contact 50 and drain contact 52 electrically coupled to opposing ends of doped semiconductor layer 20. The substantially uniform doping profile can be present throughout the materials of doped semiconductor layer 20 forming the electrical connection between source and drain contacts 50, 52.

As discussed elsewhere herein, doped semiconductor layer 20 can be formed by, e.g., introducing dopants into one or more semiconductor fins 18 (FIG. 2) to create the substantially uniform doping profile. In this situation, the view of FIG. 6 can represent a cross section of a finFET structure with doped semiconductor layer 20 being one of a plurality of doped semiconductor fins in the finFET structure. In this situation, each fin of the finFET structure can have the substantially uniform doping profile, with first gate structure 30 and second gate structure 40 contacting several doped semiconductor layers 20 through several dielectric layers 22.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming an integrated circuit (IC) structure, the method comprising:
    forming a doped semiconductor layer on an insulator layer, the doped semiconductor layer having a substantially uniform doping profile;
    forming a dielectric layer on the doped semiconductor layer;
    forming a first gate material and a second gate material on the dielectric layer, wherein the second gate material includes a metal-insulator transition material; and
    forming a source contact at an end of the doped semiconductor layer and forming a drain contact at an opposing end of the doped semiconductor layer, wherein a separation distance between the first gate material and the second gate material is larger than a separation distance between the second gate material and the source contact.

2. The method of claim 1, wherein the metal-insulator transition material comprises vanadium oxide.

3. The method of claim 1, wherein the forming of the doped semiconductor layer further includes doping a semiconductor layer with one of a p-type dopant and an n-type dopant to create the substantially uniform doping profile.

4. The method of claim 1, wherein the substantially uniform doping profile of the doped semiconductor layer is between approximately $1.0 \times 10^{19}$ atoms per cubic centimeter (atoms/cm$^3$) and approximately $3.0 \times 10^{19}$ atoms/cm$^3$.

5. The method of claim 1, further comprising electrically biasing the first gate material to create a difference in electric potential between the second gate material and the doped semiconductor layer and increase a conductivity of the second gate material.

6. The method of claim 1, further comprising forming an interlayer contact on each of the first gate material and the second gate material.

7. The method of claim 1, wherein the dielectric layer comprises hafnium oxide (HfO$_2$).

8. A method of forming an integrated circuit (IC) structure, the method comprising:
    forming a doped semiconductor layer on an insulator layer, the doped semiconductor layer having a substantially uniform doping profile;
    forming a dielectric layer on the doped semiconductor layer;
    forming a first gate material and a second gate material on the dielectric layer, wherein the second gate material includes a metal-insulator transition material; and
    electrically biasing the first gate material to create a difference in electric potential between the second gate material and the doped semiconductor layer and increase a conductivity of the second gate material.

9. The method of claim 8, wherein the metal-insulator transition material comprises vanadium oxide.

10. The method of claim 8, wherein the forming of the doped semiconductor layer further includes doping a semiconductor layer with one of a p-type dopant and an n-type dopant to create the substantially uniform doping profile.

11. The method of claim 8, further comprising forming a source contact at an end of the doped semiconductor layer and forming a drain contact at an opposing end of the doped semiconductor layer.

12. The method of claim 11, wherein a separation distance between the first gate material and the second gate material is larger than a separation distance between the second gate material and the source contact.

13. The method of claim 8, wherein the substantially uniform doping profile of the doped semiconductor layer is between approximately $1.0 \times 10^{19}$ atoms per cubic centimeter (atoms/cm3) and approximately $3.0 \times 10^{19}$ atoms/cm$^3$.

14. The method of claim 8, further comprising electrically biasing the first gate material to create a difference in electric potential between the second gate material and the doped semiconductor layer and increase a conductivity of the second gate material.

15. The method of claim 8, further comprising forming an interlayer contact on each of the first gate material and the second gate material.

16. The method of claim 8, wherein the dielectric layer comprises hafnium oxide (HfO$_2$).

17. A method of forming an integrated circuit (IC) structure, the method comprising:
    providing a structure including:
        a doped semiconductor layer positioned on an insulator layer, the doped semiconductor layer having a substantially uniform doping profile,
        a dielectric layer positioned on the doped semiconductor layer,
        a first gate material positioned on the dielectric layer, and
        a second gate material on the dielectric layer, wherein the second gate material includes a metal-insulator transition material; and electrically biasing the first gate material to create a difference in electric potential between the second gate material and the doped semiconductor layer and increase a conductivity of the second gate material.

18. The method of claim 17, wherein the dielectric layer comprises hafnium oxide ($HfO_2$).

19. The method of claim 17, further comprising forming a source contact at an end of the doped semiconductor layer and forming a drain contact at an opposing end of the doped semiconductor layer.

20. The method of claim 19, wherein a separation distance between the first gate material and the second gate material is larger than a separation distance between the second gate material and the source contact.

* * * * *